United States Patent
Sato et al.

(10) Patent No.: US 11,067,391 B2
(45) Date of Patent: Jul. 20, 2021

(54) CHARGED PARTICLE BEAM DEVICE AND SAMPLE THICKNESS MEASUREMENT METHOD

(71) Applicant: Hitachi High-Tech Corporation, Tokyo (JP)

(72) Inventors: Takahiro Sato, Tokyo (JP); Tsunenori Nomaguchi, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 16/618,835

(22) PCT Filed: Jun. 13, 2017

(86) PCT No.: PCT/JP2017/021737
§ 371 (c)(1),
(2) Date: Dec. 3, 2019

(87) PCT Pub. No.: WO2001/229848
PCT Pub. Date: Dec. 20, 2018

(65) Prior Publication Data
US 2020/0132448 A1    Apr. 30, 2020

(51) Int. Cl.
*G01B 15/02*    (2006.01)
*G01N 23/2251*    (2018.01)
(Continued)

(52) U.S. Cl.
CPC ......... *G01B 15/02* (2013.01); *G01N 23/2206* (2013.01); *G01N 23/2251* (2013.01);
(Continued)

(58) Field of Classification Search
CPC .. G01B 15/02; G01N 23/2251; G01N 23/225; G01N 23/2206; G01N 2223/633;
(Continued)

(56) References Cited

U.S. PATENT DOCUMENTS

| | | | |
|---|---|---|---|
| 5,525,806 A | 6/1996 | Iwasaki et al. | |
| 5,656,811 A | 8/1997 | Itoh et al. | |

(Continued)

FOREIGN PATENT DOCUMENTS

| | | | |
|---|---|---|---|
| JP | 2-266208 A | 10/1990 | |
| JP | 6-231720 A | 8/1994 | |

(Continued)

OTHER PUBLICATIONS

International Search Report (PCT/ISA/210) issued in PCT Application No. PCT/JP2017/021737 dated Sep. 5, 2017 with English translation (five (5) pages).
Japanese-language Written Opinion (PCT/ISA/237) issued in PCT Application No. PCT/JP2017/021737 dated Sep. 5, 2017 (four (4) pages).

*Primary Examiner* — Kiet T Nguyen
(74) *Attorney, Agent, or Firm* — Crowell & Moring LLP

(57) ABSTRACT

Provided is a charged particle beam device which includes a storage unit that stores relationship information indicating a relationship between intensity or an intensity ratio of a charged particle signal obtained when a layer disposed on the sample is irradiated with the charged particle beam and a thickness of the layer; and a calculation unit that calculates the thickness of the layer as a thickness of the sample by using the relationship information and the intensity or the intensity ratio of the charged particle signal.

14 Claims, 14 Drawing Sheets

(51) Int. Cl.
*H01J 37/244* (2006.01)
*H01J 37/28* (2006.01)
*H01J 37/317* (2006.01)
*G01N 23/2206* (2018.01)

(52) U.S. Cl.
CPC ............ *H01J 37/244* (2013.01); *H01J 37/28* (2013.01); *H01J 37/3174* (2013.01)

(58) Field of Classification Search
CPC ...... H01J 37/244; H01J 37/28; H01J 37/3174; H01J 37/3005; H01J 37/222; H01J 2237/30466; H01J 2237/31745; H01J 2237/24578; H01J 2237/31732
USPC .................................................. 250/306, 307
See application file for complete search history.

(56) References Cited

U.S. PATENT DOCUMENTS

| | | | |
|---|---|---|---|
| 2008/0067384 A1 | 3/2008 | Ikku et al. | |
| 2016/0071688 A1 | 3/2016 | Goto et al. | |
| 2016/0093468 A1* | 3/2016 | Lang | H01J 37/3053 216/59 |
| 2017/0269011 A1* | 9/2017 | Statham | G01N 23/2252 |

FOREIGN PATENT DOCUMENTS

| | | |
|---|---|---|
| JP | 7-333120 A | 12/1995 |
| JP | 2008-267895 A | 11/2008 |
| JP | 2014-41092 A | 3/2014 |
| WO | WO 2006/073063 A1 | 7/2006 |
| WO | WO 2014/175150 A1 | 10/2014 |

\* cited by examiner

[FIG. 1]
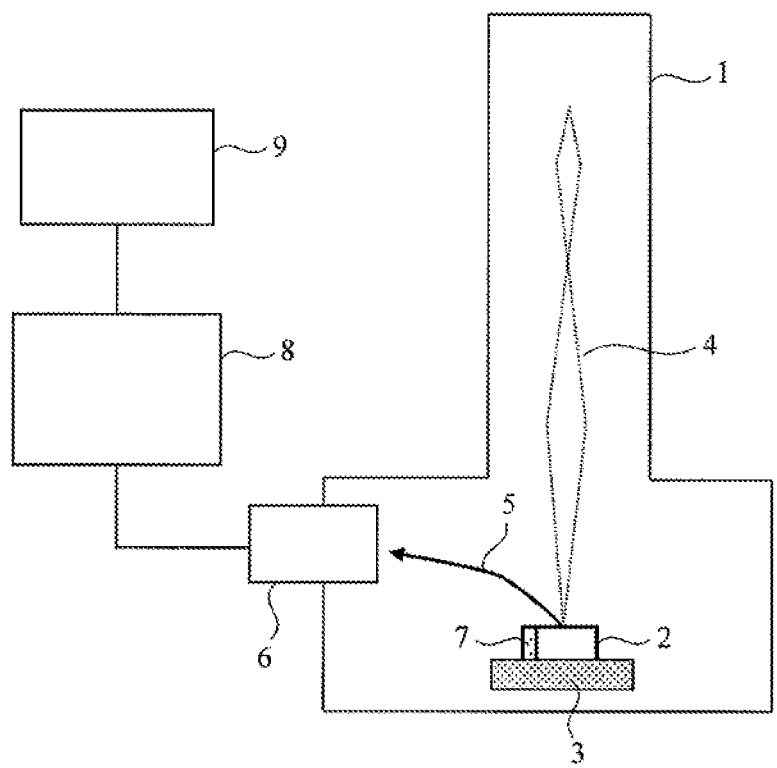
[FIG. 2A]
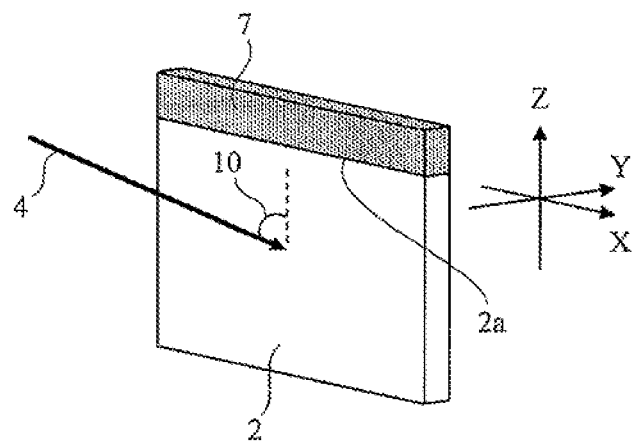

[FIG. 2B]
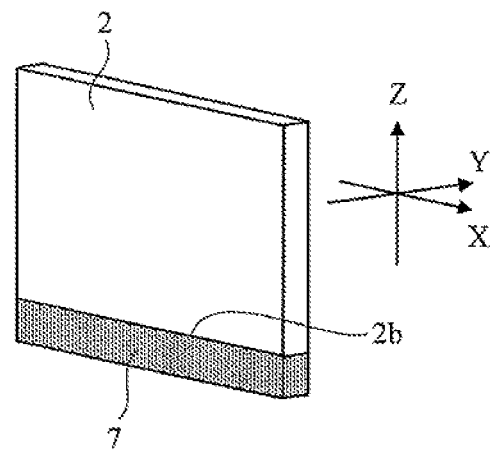
[FIG. 2C]
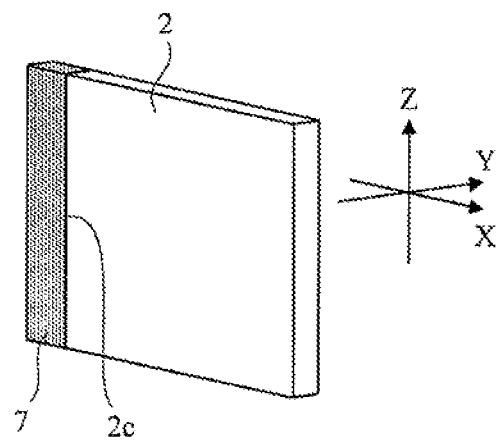

[FIG. 2D]
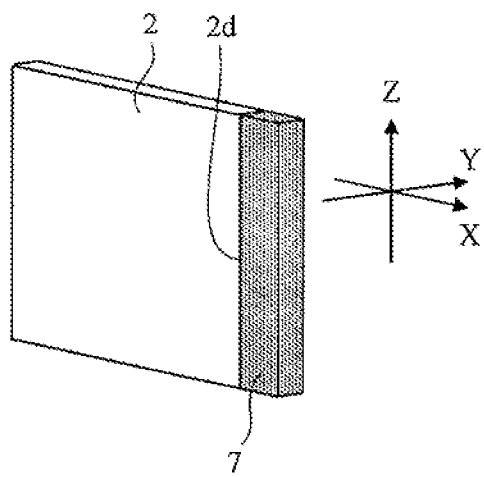
[FIG. 3A]
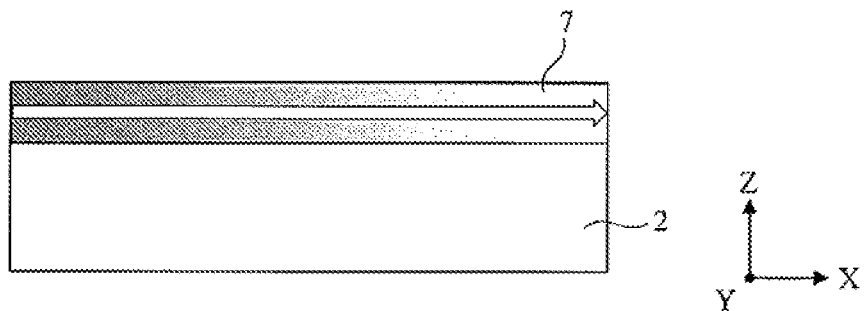
[FIG. 3B]
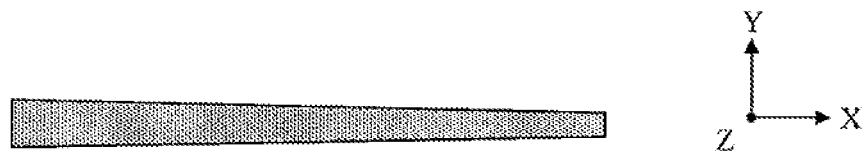

[FIG. 3C]
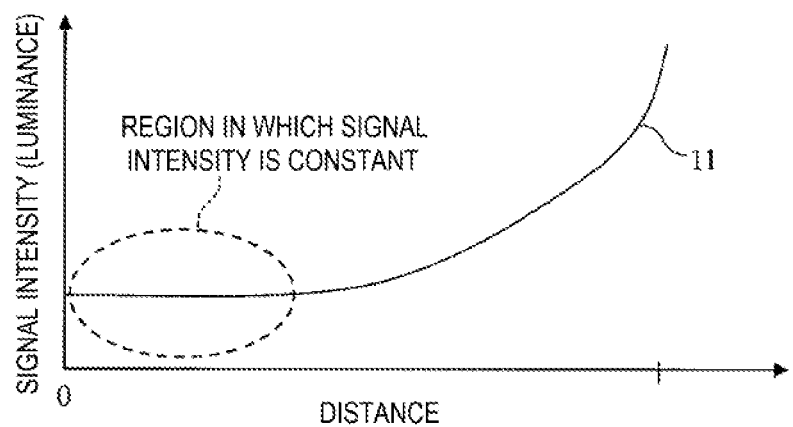
[FIG. 4A]
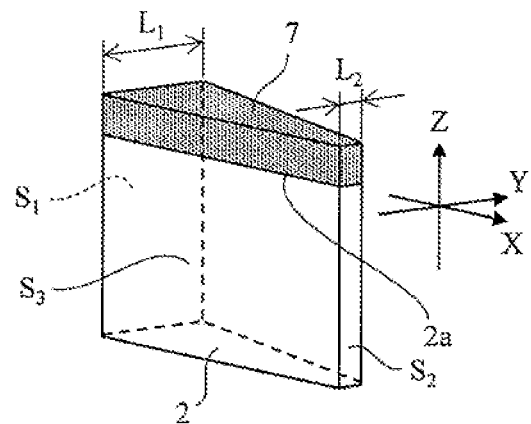

[FIG. 4B]
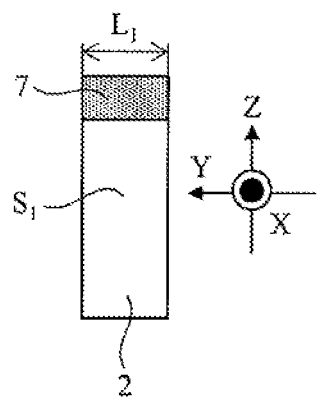
[FIG. 4C]
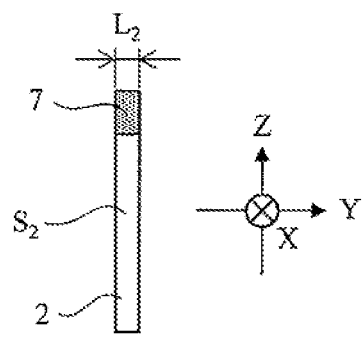
[FIG. 4D]
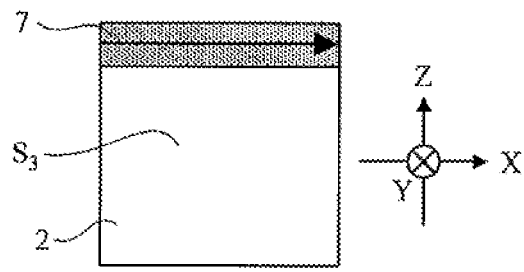

[FIG. 4E]
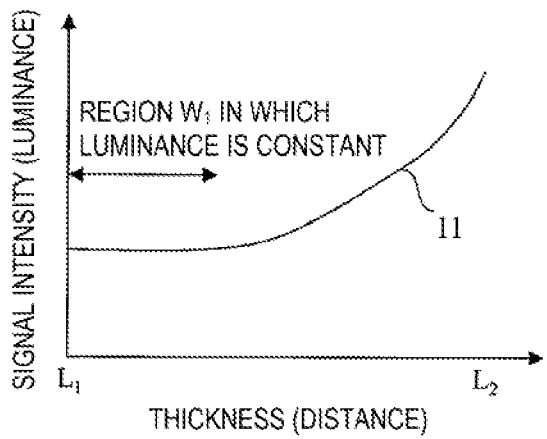
[FIG. 4F]
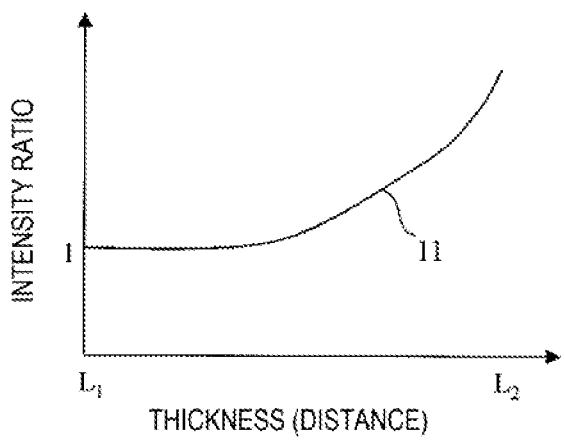
[FIG. 5]
| | FILM THICKNESS | | | |
|---|---|---|---|---|
| | $t_1$ | · | · | $t_n$ |
| SIGNAL INTENSITY OR SIGNAL INTENSITY RATIO | $I_1$ | · | · | $I_n$ |
RELATIONSHIP OF SIGNAL INTENSITY OR SIGNAL
INTENSITY RATIO (I) AND FILM THICKNESS (T)

[FIG. 6A]
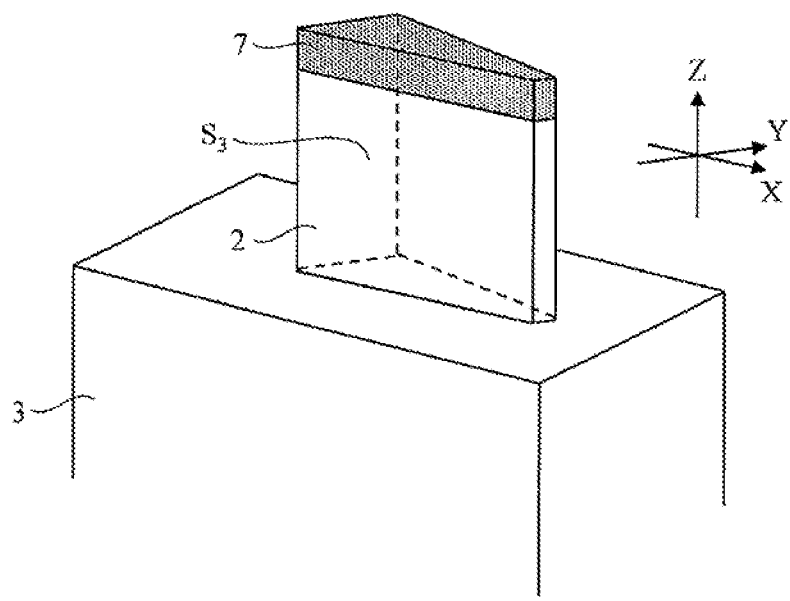
[FIG. 6B]
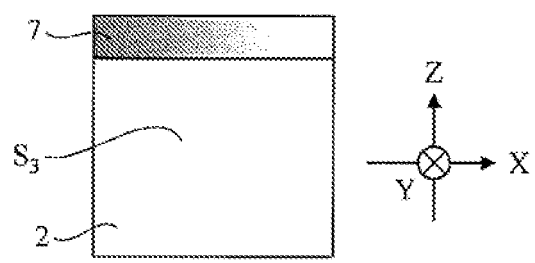

[FIG. 6C]
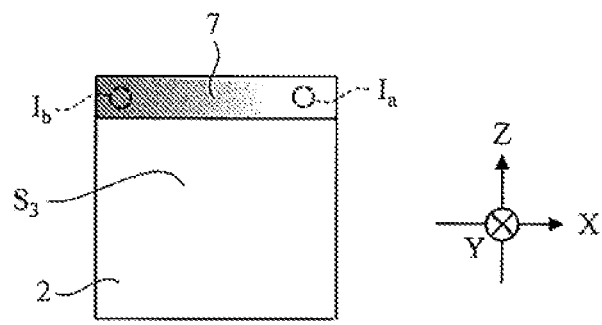
[FIG. 7]
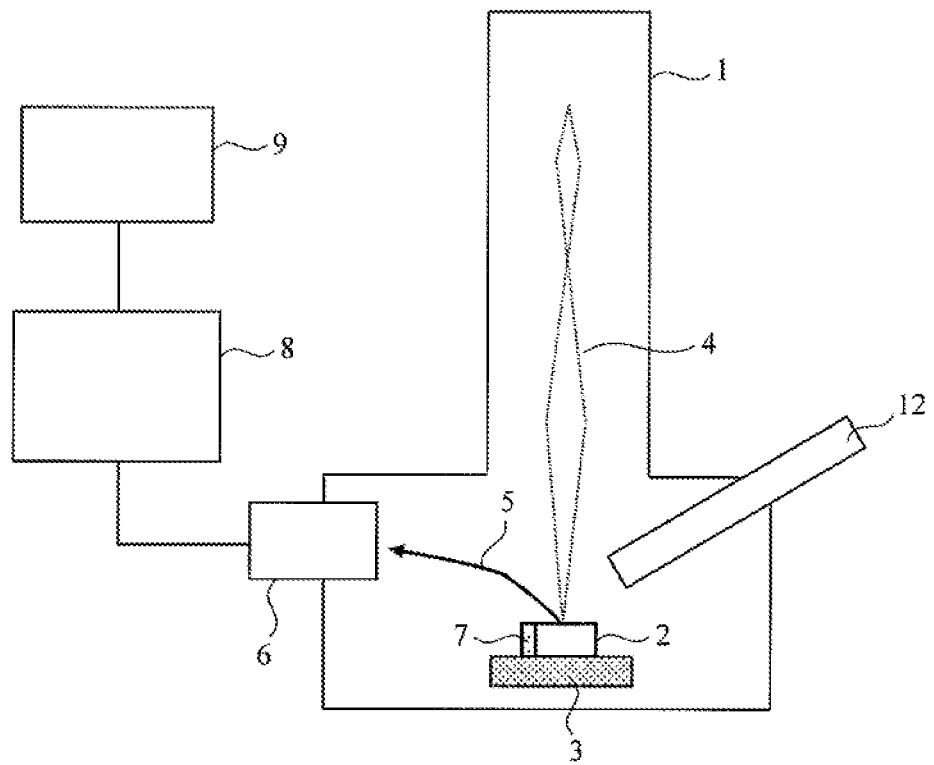

[FIG. 8]
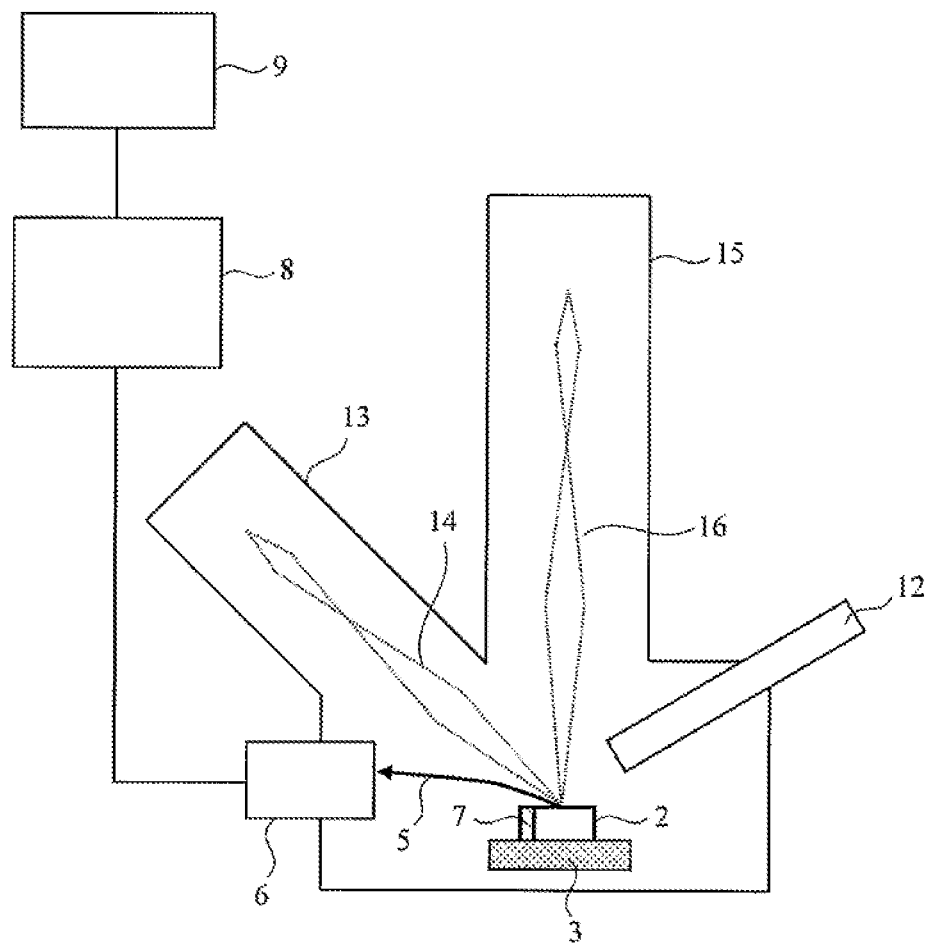
[FIG. 9A]
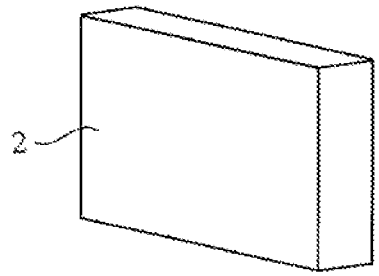

[FIG. 9B]
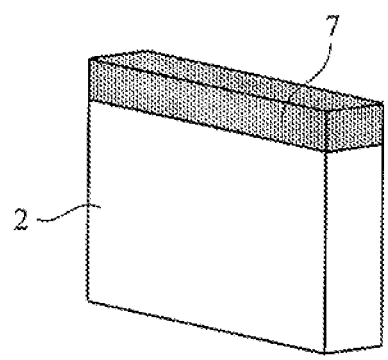
[FIG. 9C]
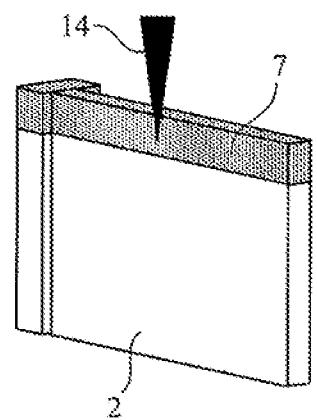

[FIG. 9D]
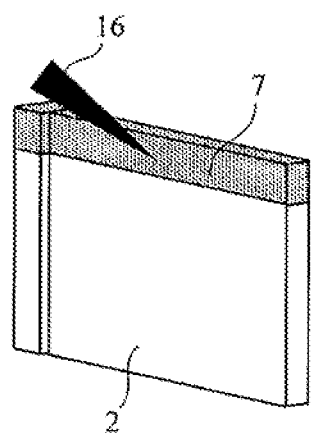
[FIG. 10A]
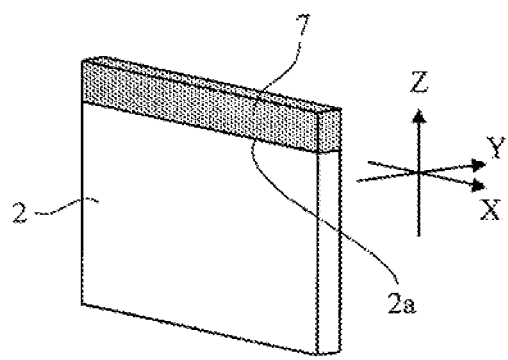

[FIG. 10B]
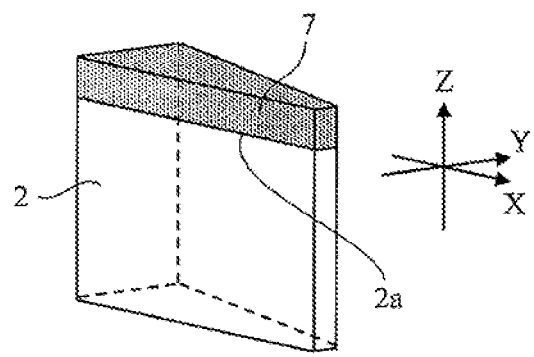
[FIG. 10C]
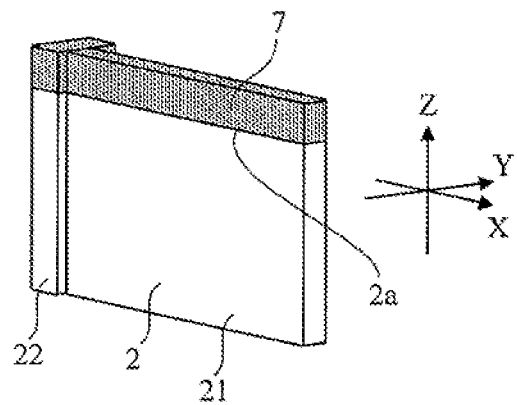

[FIG. 10D]
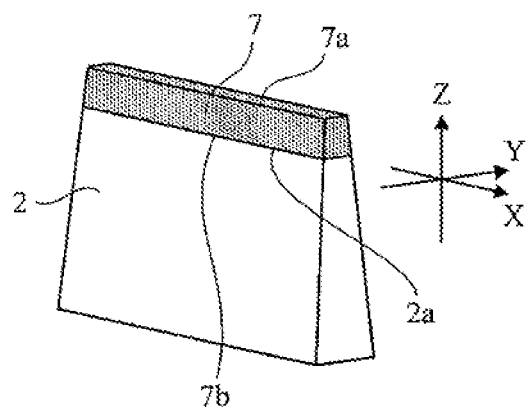
[FIG. 11]
|  |  | FILM THICKNESS | | | |
|---|---|---|---|---|---|
|  |  | $t_1$ | . | . | $t_n$ |
| ACCELERATION VOLTAGE | $V_1$ | $I_{11}$ | . | . | $I_{1n}$ |
|  | . | . | . | . | . |
|  | . | × | × | × | × |
|  | $V_n$ | $I_{n1}$ | . | . | $I_{nn}$ |
RELATIONSHIP OF ACCELERATION VOLTAGE (V), FILM THICKNESS (T), AND INTENSITY OR INTENSITY RATIO (I)

[FIG. 12]

WHEN INCIDENT ANGLE IS $\theta_1$

|  |  | FILM THICKNESS | | |
|---|---|---|---|---|
|  |  | $t_1$ | · · | $t_n$ |
| ACCELERATION VOLTAGE | $V_1$ | $I_{11}$ | · · | $I_{1n}$ |
|  | · | · | · · | · |
|  | · | · | · · | · |
|  | $V_n$ | $I_{n1}$ | · · | $I_{nn}$ |

WHEN INCIDENT ANGLE IS $\theta_2$

|  |  | FILM THICKNESS | | |
|---|---|---|---|---|
|  |  | $t_1$ | × × | $t_n$ |
| ACCELERATION VOLTAGE | $V_1$ | $I_{11}$ | · · | $I_{1n}$ |
|  | · | × | × × | × |
|  | · | · | · · | · |
|  | $V_n$ | $I_{n1}$ | · · | $I_{nn}$ |

· · · · · · · · · · · · · · · · · · · ·

WHEN INCIDENT ANGLE IS $\theta_N$

|  |  | FILM THICKNESS | | |
|---|---|---|---|---|
|  |  | $t_1$ | · · | $t_n$ |
| ACCELERATION VOLTAGE | $V_1$ | $I_{11}$ | · · | $I_{1n}$ |
|  | × | × | × × | × |
|  | · | · | · · | · |
|  | $V_n$ | $I_{n1}$ | · · | $I_{nn}$ |

RELATIONSHIP OF INCIDENT ANGLE ($\theta$), ACCELERATION VOLTAGE (V),
FILM THICKNESS (T), AND INTENSITY RATIO (I)

CHARGED PARTICLE BEAM DEVICE AND SAMPLE THICKNESS MEASUREMENT METHOD

TECHNICAL FIELD

The present invention relates to a charged particle beam device and a sample thickness measurement method.

BACKGROUND ART

A focused ion beam (focused ion beam: FIB) device which is one of a charged particle beam device performs fine processing by utilizing a sputtering phenomenon of target constituent atoms generated when a sample is irradiated with a focused ion beam. Recently, devices combining a scanning electron microscope (SEM) or a scanning transmission electron microscope (STEM) to the FIB device have been commercialized. These devices are designed such that an FIB irradiation axis and an electron beam irradiation axis intersect at the same point in a device, which has an advantage that an FIB processing cross-section can be observed by the SEM without moving the sample.

An application of the FIB device is cross-sectional processing for SEM observation, sample preparation for STEM or transmission electron microscope (TEM) observation, and the like. The TEM method or the STEM method is a method of observing an internal structure of a thin film sample by irradiating the sample with a high acceleration electron beam and forming an image of a transmitted electron beam. In these methods, since transmitted electrons are used for imaging, a thin film is used as an observation sample. A typical recommended sample thickness is 100 nm or less when an acceleration voltage is 200 kV. However, in preparation of a semiconductor thin film sample, a thickness of the thin film must be processed to about several tens of nm since miniaturization of device structure has progressed year by year. In preparing samples for TEM and STEM observation, techniques of measuring the thickness of a thin film sample with high accuracy during FIB processing are needed.

Secondary electrons generated during FIB processing include information reflecting a sample surface structure. An image in which the signal intensity of secondary electrons in synchronization with the scanning of the FIB is two-dimensionally displayed is referred to as a scanning ion microscope (SIM) image. In a sample thickness measurement method used in related arts, the sample thickness is measured by SIM observation of a thin film sample from above. However, since the sample is observed from right above, it is difficult to obtain information in the depth direction of the sample and to accurately measure a target position. Lower resolution of the SIM image compared with an SEM image also causes a decrease in measurement accuracy. Patent Literature 1 discloses a film thickness measurement method using the electron beam, in which the film thickness is measured by calculating an intensity ratio of reflected electrons in a film thickness measurement region and reflected electrons of a reference sample.

PRIOR ART LITERATURE

Patent Literature

PTL 1: JP-A-2008-267895

SUMMARY OF INVENTION

Technical Problem

In the method of Patent Literature 1, it is necessary to prepare a reference sample in addition to a film thickness sample to be measured, which causes several problems for implementation. First, it is necessary for the reference sample to have the same material and composition as the film thickness measurement region and the thickness thereof needs to be known. When the sample has a single structure or a single composition, the method of Patent Literature 1 is applicable. However, when the structure or composition inside the sample is uneven, the electron beam intensity changes for each observation region, leaving the method of Patent Literature 1 not applicable. Second, in order to improve the accuracy of film thickness measurement, it is necessary to prepare two or more reference samples having different thicknesses. In a semiconductor sample, a plurality of reference samples cannot be prepared because a defective part can be at only one point.

Therefore, a technique capable of measuring the thickness of a sample without preparing the reference sample is disclosed hereinafter.

Solution to Problem

In order to solve the above problems, for example, a configuration described in the claims is adopted. The present application includes a plurality of methods for solving the above-mentioned problems and provides, for example, a charged particle beam device which includes: a charged particle beam column that is configured to emit a charged particle beam; a sample support mechanism that is configured to support a sample to be measured; a detector that is configured to detect a charged particle signal obtained when the sample is irradiated with the charged particle beam; a storage unit that is configured to store relationship information indicating a relationship between intensity or an intensity ratio of a charged particle signal obtained when a layer disposed on the sample is irradiated with the charged particle beam and a thickness of the layer; and a calculation unit that is configured to calculate the thickness of the layer as a thickness of the sample by using the relationship information and the intensity or the intensity ratio of the charged particle signal.

In addition, according to another example, there is provided a composite charged particle beam device which includes: an ion beam column that is configured to emit an ion beam; an electron beam column that is configured to emit an electron beam; a sample support mechanism that is configured to support a sample; a detector that is configured to detect a charged particle signal obtained when the sample is irradiated with the electron beam; a function of forming a layer on a surface of the sample using the ion beam or the electron beam and compound gas; a storage unit that is configured to store relationship information indicating a relationship between intensity or an intensity ratio of a charged particle signal obtained when the layer is irradiated with the electron beam and a thickness of the layer; and a calculation unit that is configured to calculate the thickness of the layer as a thickness of the sample by using the relationship information and the intensity or the intensity ratio of the charged particle signal.

In addition, according to another example, there is provided a thickness measurement method of a sample which includes: forming a layer on a surface of the sample; processing the sample using an ion beam; irradiating the processed sample with an electron beam; detecting a charged particle signal obtained when the layer is irradiated with the electron beam; and calculating a thickness of the processed sample using relationship information indicating a relationship between intensity or an intensity ratio of the charged particle signal and a thickness of the layer.

Advantageous Effect

According to the invention, it is possible to measure the thickness of a sample without preparing a reference sample. Further features relating to the invention will be apparent from the description of the specification and the accompanying drawings. In addition, problems, configurations, and effects other than those described above will be clarified by the descriptions of following embodiments.

BRIEF DESCRIPTION OF DRAWINGS

FIG. 1 is a schematic view showing a configuration of a charged particle beam device according to one embodiment.

FIG. 2A shows a sample and a deposited film on the sample according to the embodiment.

FIG. 2B shows the sample and the deposited film on the sample according to the embodiment.

FIG. 2C shows the sample and the deposited film on the sample according to the embodiment.

FIG. 2D shows the sample and the deposited film on the sample according to the embodiment.

FIG. 3A is a cross-sectional charged particle beam image of a sample having a deposited film according to the embodiment.

FIG. 3B is a planar charged particle beam image of the sample having a deposited film according to the embodiment.

FIG. 3C is a line profile of signal intensity extracted in a direction of an arrow in the deposited film of FIG. 3A.

FIG. 4A is a diagram showing a sample thickness measurement method according to the embodiment.

FIG. 4B is a diagram showing the sample thickness measurement method according to the embodiment.

FIG. 4C is a diagram showing the sample thickness measurement method according to the embodiment.

FIG. 4D is a diagram showing the sample thickness measurement method according to the embodiment.

FIG. 4E is a line profile of signal intensity according to the embodiment.

FIG. 4F is a line profile of a signal intensity ratio according to the embodiment.

FIG. 5 is a diagram showing relationship information according to the embodiment.

FIG. 6A is a diagram showing the sample thickness measurement method according to the embodiment.

FIG. 6B is a diagram showing the sample thickness measurement method according to the embodiment.

FIG. 6C is a diagram showing the sample thickness measurement method according to the embodiment.

FIG. 7 is a schematic view showing a configuration of a charged particle beam device according to another embodiment.

FIG. 8 is a schematic view showing a configuration of a composite charged particle beam device according to another embodiment.

FIG. 9A is a diagram showing a sample thickness measurement method according to the embodiment.

FIG. 9B is a diagram showing the sample thickness measurement method according to the embodiment.

FIG. 9C is a diagram showing the sample thickness measurement method according to the embodiment.

FIG. 9D is a diagram showing the sample thickness measurement method according to the embodiment.

FIG. 10A shows a sample and a deposited film on the sample according to the embodiment.

FIG. 10B shows the sample and the deposited film on the sample according to the embodiment.

FIG. 10C shows the sample and the deposited film on the sample according to the embodiment.

FIG. 10D shows the sample and the deposited film on the sample according to the embodiment.

FIG. 11 is a diagram showing relationship information according to the embodiment.

FIG. 12 is a diagram showing relationship information according to the embodiment.

DESCRIPTION OF EMBODIMENTS

Hereinafter, embodiments of the invention will be described with reference to the accompanying drawings. Although the accompanying drawings show specific embodiments in accordance with the principles of the invention, they are for the purpose of understanding the invention and are not to limit interpretation of the invention.

The following embodiments relate to a charged particle beam device having a function of measuring a thickness of an observation sample. The charged particle beam device uses charged particles generated secondarily by scanning a sample surface with a charged particle beam. Examples of the charged particle beam device include an electron microscope, an electron beam lithography device, an ion processing device, and an ion microscope. The following embodiments are applicable to the above-described charged particle beam devices.

FIG. 1 is a schematic view showing a configuration of a charged particle beam device according to one embodiment. The charged particle beam device includes: a charged particle beam column 1; a sample support mechanism 3 that supports a sample 2; a detector 6 that detects a charged particle signal 5 obtained when the sample 2 is irradiated with a charged particle beam 4; a storage unit 8 that stores intensity or an intensity ratio of the charged particle signal 5 obtained when a layer (for example, a deposited film) 7 disposed on the sample 2 to be measured is irradiated with the charged particle beam 4 for each thickness of the layer 7; and a calculation unit 9 that calculates the thickness of the layer 7 as the thickness of the sample 2 by using information of the storage unit 8 and the charged particle signal detected by the detector 6.

The charged particle beam column 1 includes a charged particle beam optical system. As an example, the charged particle beam optical system includes a charged particle beam source that emits a charged particle beam, a lead electrode, a condenser lens, a deflection electrode, and an objective lens. The charged particle beam column 1 may include other lenses, electrodes, and detectors, a part thereof may be different from the above, and the configuration of the charged particle beam optical system is not limited thereto.

The calculation unit 9 may be implemented using a general-purpose computer or may be implemented as a function of a program executed on a computer. That is, the processing of the calculation unit 9 may be stored in a memory as program codes and implemented by a processor such as a central processing unit (CPU) that executes each program code.

In the present embodiment, the layer 7 for thickness measurement is disposed on the sample 2 to be measured. In the following description, the layer 7 is referred to as a deposited film, but any layer for thickness measurement may be formed on the sample 2 to be measured. The charged particle beam device according to the present embodiment can obtain the thickness of the sample 2 by calculating the thickness of the deposited film 7.

In the present embodiment, the deposited film 7 is deposited outside the charged particle beam device. The deposited film 7 may also be deposited in the charged particle beam device, and the configuration will be described below. FIGS. 2A to 2D are schematic views of the sample 2 and the deposited film 7 disposed on the sample 2. The deposited film 7 is a carbon, tungsten, platinum, or oxide film. The deposited film 7 may be formed of a conductive material or an insulating material, and is not limited to these materials.

The deposited film 7 can be disposed at an arbitrary position of the sample 2. In FIG. 2A, the deposited film 7 is disposed on an XY plane of an upper part 2a of the sample 2. In FIG. 2A, for example, the charged particle beam 4 is emitted onto an XZ plane. An incident angle 10 of the charged particle beam 4 with respect to the XZ plane is arbitrary. In FIG. 2B, the deposited film 7 is disposed on the XY plane of a lower part 2b of the sample 2. In FIG. 2C, the deposited film 7 is disposed on an YZ plane of a left side surface 2c of the sample 2. In FIG. 2D, the deposited film 7 is disposed on the YZ plane of a right side surface 2d of the sample 2.

A concept of thickness measurement of the sample 2 will be described referring to FIGS. 3A to 3C. FIG. 3A is a cross-sectional charged particle beam image of the sample 2 having the deposited film 7 and FIG. 3B is a planar charged particle beam image of the sample 2. In this example, the thickness of the sample 2 is gradually reduced from the left side to the right side in the drawing, and a direction of change in thickness is not limited to this. In FIG. 3A, contrast of the deposited film 7 is dark on the left side and grows brighter toward the right side. This shows that the brighter the contrast is, the smaller the thickness of the deposited film 7 is.

FIG. 3C is a line profile 11 of signal intensity extracted in a direction of an arrow (see FIG. 3A) with respect to the deposited film 7. The line profile 11 indicates a change in signal intensity when a vertical axis represents the signal intensity (luminance) and a horizontal axis represents a distance from a left end in FIGS. 3A and 3B (the left end is an origin point). On the left side of FIG. 3C, there is a region having a constant luminance and the luminance increases toward the right side. In the present embodiment, the thickness of the sample 2 is measured by utilizing a property that the brightness of the charged particle beam image varies depending on the thickness of the deposited film 7. According to the configuration, it is possible to measure the thickness without depending on the composition, material, and the like of the sample 2. In addition, since the deposited film 7 on the sample 2 is used, the thickness of the sample 2 can be measured without preparing a reference sample separately from the sample 2.

FIGS. 4A to 4F show an example of thickness measurement of the sample 2. As shown in FIG. 4A, herein the wedge-shaped sample 2 is used and the deposited film 7 is disposed on the XY plane of the upper part 2a of the sample 2.

As shown in FIG. 4B, the sample 2 rotates around a Z-axis, a surface S1 of the sample 2 is observed from the X-axis direction using the charged particle beam 4, and a length L1 is measured. The incident angle of the charged particle beam 4 on a ZY plane is arbitrary. As another example, the surface S1 may also be observed from a −Z direction using the charged particle beam 4.

Next, as shown in FIG. 4C, the sample 2 rotates around the Z-axis, a surface S2 of the sample 2 is observed using the charged particle beam 4, and a length L2 is measured. The incident angle of the charged particle beam 4 on the ZY plane is arbitrary. As another example, the surface may also be observed from the −Z direction using the charged particle beam 4.

Next, as shown in FIG. 4D, the sample 2 rotates around the Z-axis, and a surface S3 of the sample 2 is observed using the charged particle beam 4. The calculation unit 9 calculates the line profile 11 of the signal intensity in the X direction (arrow direction) with respect to the deposited film 7 of the charged particle beam image acquired here.

FIG. 4E is an example of the line profile 11 of signal intensity. In the line profile 11 of FIG. 4E, the vertical axis indicates the signal intensity in the deposited film 7 of the charged particle beam image, and the horizontal axis indicates a distance from the left end (the left end in FIG. 4D) of the sample 2. Since the thickness at the left end is L1 and the thickness at the right end corresponds to L2, the signal intensity in the charged particle beam image corresponding to each thickness in the sample 2 can be seen.

The calculation unit 9 may also normalize the line profile 11 with an intensity value of a range ($W_1$) in which the signal intensity does not change. FIG. 4F shows an example of the line profile 11 of a signal intensity ratio. In the line profile 11 of FIG. 4F, the vertical axis refers to an intensity ratio obtained by dividing each signal intensity value by the signal intensity value in the $W_1$ range, and the horizontal axis refers to the distance from the left end (the left end in FIG. 4D) of the sample 2. According to the line profile 11, the intensity ratio corresponding to each thickness in the sample 2 can be seen. In the observation using the charged particle beam device, an absolute value of the signal intensity acquired over time changes. Therefore, it is desirable to use information indicating a relative intensity such as the signal intensity ratio.

The calculation unit 9 stores relationship information indicating the relationship between the signal intensity or the signal intensity ratio of the charged particle signal 5 and the thickness of the deposited film 7 in the storage unit 8. FIG. 5 shows an example of a table showing the relationship between the signal intensity or the signal intensity ratio of the charged particle signal 5 and the thickness of the deposited film 7. Although the relationship information is shown in a table structure, it may not be represented by a data structure based on a table. Hereinafter, in order to show that the relationship information does not depend on the data structure, it is simply referred to as "relationship information".

FIGS. 6A to 6C are diagrams showing a thickness measurement method of the sample 2 using the relationship information created in advance as described above. Here, a case is described where the storage unit 8 stores relationship information indicating the relationship between the signal intensity ratio of the charged particle signal 5 and the thickness of the deposited film 7.

As shown in FIG. 6A, the sample 2 to be measured is disposed on the sample support mechanism 3. A configuration of the sample support mechanism 3 is not limited as long as the sample 2 can be supported. The sample 2 may be a parallel plate or have a wedge shape. In the present embodiment, the wedge-shaped sample 2 is used.

Next, as shown in FIG. 6B, the calculation unit 9 acquires a charged particle beam image of the surface S3 of the sample 2 from the charged particle signal 5 obtained when the sample 2 is irradiated with the charged particle beam 4.

Next, as shown in FIG. 6C, the calculation unit 9 acquires signal intensity ($I_a$) of the deposited film 7 near a region where the thickness is measured, and signal intensity ($I_b$) of the deposited film 7 from a region where the signal intensity is constant using the acquired charged particle beam image, and obtains an intensity ratio ($I_a/I_b$). The calculation unit 9 calculates the thickness of the deposited film 7 corresponding to the intensity ratio ($I_a/I_b$) as the thickness of the sample 2 from the relationship information stored in advance in the storage unit 8.

When the storage unit 8 stores the relationship information between the signal intensity and the thickness of the deposited film 7, the calculation unit 9 may calculate the thickness of the deposited film 7 corresponding to the signal intensity ($I_a$) near the region where the thickness is measured as the thickness of the sample 2.

The charged particle beam device according to the above embodiment includes: the charged particle beam column 1 that irradiates the charged particle beam 4; the sample support mechanism 3 that supports the sample 2 to be measured; the detector 6 that detects the charged particle signal 5 obtained when the sample 2 is irradiated with the charged particle beam 4; the storage unit 8 that stores relationship information indicating the relationship between intensity or intensity ratio of the charged particle signal 5 obtained when the deposited film 7 disposed on the sample 2 is irradiated with the charged particle beam 4 and the thickness of the deposited film 7; and the calculation unit 9 that calculates the thickness of the deposited film 7 as the thickness of the sample 2, by using the relationship information and the signal intensity of the charged particle signal 5 detected by the detector 6. According to this configuration, since the deposited film 7 disposed on the sample 2 is used as a layer for thickness measurement, the thickness of the sample 2 can be measured without preparing a reference sample separately from the sample 2.

FIG. 7 is a schematic view showing a configuration of a charged particle beam device according to another embodiment. The charged particle beam device according to the embodiment has a deposited film forming function 12 for forming the deposited film 7 on the sample 2. The deposited film 7 can be formed on the sample 2 by spraying compound gas near a charged particle beam irradiation region on the surface of the sample 2. Secondary charged particles are generated when the sample 2 is irradiated with the primary charged particle beam 4. The secondary charged particles contribute to decomposition of the compound gas and the compound gas is separated into a gas component and a solid component. The gas component is evacuated to vacuum. The deposited film 7 is formed by depositing the solid component on the surface of the sample 2. The deposited film forming function 12 refers to, for example, a compound gas supply device that supplies a compound gas as a raw material of the deposited film 7 to the periphery of the charged particle beam irradiation region. The deposited film 7 is a carbon, tungsten, platinum, or oxide film. The deposited film 7 may be made of a conductive material or an insulating material and is not limited thereto.

FIG. 8 is a schematic view showing a configuration of a composite charged particle beam device according to another embodiment. The composite charged particle beam device according to the embodiment includes an ion beam column 13 that emits an ion beam 14, an electron beam column 15 that emits an electron beam 16, and the deposited film forming function 12 for forming the deposited film 7 on the sample 2 using the ion beam 14 emitted from the ion beam column 13 or the electron beam 16 emitted from the electron beam column 15. Other configurations are the same as those in FIG. 1.

In this embodiment, the electron beam column 15 is disposed in a direction perpendicular to the surface (hereinafter referred to as a disposed surface of the sample 2) of the sample support mechanism 3 on which the sample 2 is disposed and the ion beam column 13 is disposed on an oblique direction with respect to the disposed surface of the sample 2. The electron beam column 15 may be disposed in the oblique direction with respect to the disposed surface of the sample 2 and the ion beam column 13 may be disposed in the direction perpendicular to the disposed surface of the sample 2. An angle formed by the two columns 13 and 15 is larger than 0 degree and equal to or less than 180 degrees.

FIGS. 9A to 9D are diagrams showing the processing and the thickness measurement method of the sample 2 using the composite charged particle beam device. FIG. 9A shows the sample 2 to be measured. As shown in FIG. 9B, the deposited film 7 is formed on the sample 2 by using the ion beam 14 or the electron beam 16 and the compound gas. Next, as shown in FIG. 9C, the sample 2 is processed using the ion beam 14 so that the sample 2 is thinned. Next, as shown in FIG. 9D, the deposited film 7 is irradiated with the electron beam 16. Then, the calculation unit 9 calculates the thickness of the deposited film 7 as the thickness of the sample 2 from relationship information stored in advance in the storage unit 8 by using acquired signal intensity. Steps of FIGS. 9C and 9D are repeated until a target sample thickness is reached. According to this configuration, it is possible to process the sample 2 with the ion beam 14 while measuring the thickness of the sample 2.

FIGS. 10A to 10D show examples of the sample 2 and the deposited film 7. In FIG. 10A, the sample 2 has a flat plate shape having a uniform thickness in a direction parallel to a lengthwise direction of the sample 2. The deposited film 7 is deposited on the upper part 2a of the sample 2. With this configuration, the storage unit 8 stores relationship information between the signal intensity and the thickness of the deposited film 7 and the calculation unit 9 calculates the thickness of the deposited film 7 corresponding to the signal intensity of the deposited film 7 as the thickness of the sample 2 from the relationship information.

In FIG. 10B, the sample 2 has a wedge shape in which the thickness changes continuously in a direction parallel to the lengthwise direction of the sample 2. The deposited film 7 is deposited on the upper part 2a of the sample 2. With this configuration, the thickness of the sample 2 can be obtained by the method described with reference to FIGS. 6A to 6C.

In FIG. 10C, the sample 2 has a shape with a discontinuous thickness in a direction parallel to the lengthwise direction of the sample 2. Specifically, the sample 2 includes a first part 21 and a second part 22 having a thickness larger than that of the first part 21. The deposited film 7 is deposited on the upper part 2a of the sample 2. The thickness of the deposited film 7 deposited on the second part 22 of the sample 2 is within a range where the signal intensity is constant (that is, $W_1$ in FIG. 4E). With this configuration, the storage unit 8 stores the relationship information between the signal intensity ratio and the thickness of the deposited film 7 and the calculation unit 9 obtains the thickness of the first part 21 of the sample 2 from an intensity ratio between the signal intensity of the deposited film 7 on the second part 22 and the signal intensity of the deposited film 7 on the first part 21. The calculation unit 9 may obtain the thickness of the first part 21 of the sample 2 from the relationship information between the signal intensity and the thickness of the deposited film 7.

In FIG. 10D, the sample 2 has a wedge shape in which the thickness changes continuously in a direction parallel to a widthwise direction of the sample 2. The deposited film 7 is deposited on the upper part 2a of the sample 2. With this configuration, for example, the calculation unit 9 can obtain the thickness of the sample 2 from an intensity ratio between the signal intensity at a lower end 7b of the deposited film 7 and the signal intensity at an upper end 7a of the deposited film 7. The calculation unit 9 may obtain the thickness of the sample 2 from the relationship between the signal intensity and the thickness of the deposited film 7. In addition, the sample 2 may have a shape in which the thickness changes discontinuously in a direction parallel to the widthwise direction of the sample 2.

FIG. 11 shows an example of the relationship information stored in the storage unit 8. The storage unit 8 may also store the relationship between the signal intensity or the signal intensity ratio of the charged particle signal 5 and the thickness of the deposited film 7 for each piece of energy of the charged particle beam 4. The energy of the charged particle beam 4 is, for example, an acceleration voltage. When the acceleration voltage is different, the emission rate of the charged particle signal 5 is changed, and accordingly the contrast of the deposited film 7 is different even at a same sample thickness. The calculation unit 9 stores the relationship information indicating the relationship between the signal intensity or the signal intensity ratio of the charged particle signal 5 and the thickness of the deposited film 7 in advance in the storage unit 8 for each of a plurality of different acceleration voltages. The arithmetic unit 9 can select from the relationship information the relationship between the signal intensity or the signal intensity ratio of the charged particle signal 5 and the thickness of the deposited film 7 according to the set acceleration voltage, and calculate the thickness of the deposited film 7 as the thickness of sample 2.

FIG. 12 shows another example of the relationship information stored in the storage unit 8. The storage unit 8 may also store the relationship between the signal intensity or the signal intensity ratio of the charged particle signal 5 and the thickness of the deposited film 7 for each incident angle of the charged particle beam 4. When the incident angle 10 of the charged particle beam 4 to the deposited film 7 changes, the relative thickness of the deposited film 7 changes, and accordingly the contrast of the deposited film 7 changes. The calculation unit 9 stores the relationship information indicating the relationship between the signal intensity or the signal intensity ratio of the charged particle signal 5 and the thickness of the deposited film 7 in advance in the storage unit 8 for each of a plurality of different incident angles. The arithmetic unit 9 can select from the relationship information the relationship between the signal intensity or the signal intensity ratio of the charged particle signal 5 and the thickness of the deposited film 7 according to the incident angle, and calculate the thickness of the deposited film 7 as the thickness of sample 2. In the example of FIG. 12, the storage unit 8 stores the relationship between the signal intensity or the signal intensity ratio of the charged particle signal 5 and the thickness of the deposited film 7 for each piece of energy (acceleration voltage) of the charged particle beam 4 and the incident angle of the charged particle beam 4.

As another example, the relationship between the signal intensity or the signal intensity ratio of the charged particle signal 5 and the thickness of the deposited film 7 may change depending on a type of the charged particle beam 4. For example, the charged particle beam 4 is a kind of beam selected from gallium, gold, silicon, hydrogen, helium, neon, argon, xenon, oxygen, nitrogen, or carbon. The signal intensity of the charged particle signal 5 may change depending on the type of beam. Therefore, the storage unit 8 may also store the relationship between the signal intensity or the signal intensity ratio of the charged particle signal 5 and the thickness of the deposited film 7 for each kind of the charged particle beam 4.

In addition, the charged particle signal 5 may be a signal that detects (1) transmitted electrons, (2) reflected electrons, (3) secondary charged particles, or (4) tertiary charged particles caused by the transmitted electrons, the reflected electrons, or the secondary charged particles. The relationship between the signal intensity or the signal intensity ratio of the charged particle signal 5 and the thickness of the deposited film 7 may also change depending on the type of signal to be detected by the detector 6. Therefore, the storage unit 8 may also store the relationship between the signal intensity or the signal intensity ratio of the charged particle signal 5 and the thickness of the deposited film 7 for each kind of the signal to be detected.

The relationship between the signal intensity or the signal intensity ratio of the charged particle signal 5 and the thickness of the deposited film 7 may also change depending on a manufacturing method of the deposited film 7, a composition of the deposited film 7, crystallinity of the deposited film 7, and the like. For example, the signal intensity of the charged particle signal 5 may change depending on whether the deposited film 7 is deposited by the deposited film forming function 12 or deposited on the sample 2 outside the charged particle beam device. In addition, the signal intensity of the charged particle signal 5 may also change depending on the composition of the deposited film 7 and the crystallinity of the deposited film 7. Therefore, the storage unit 8 may also store the relationship between the signal intensity or the signal intensity ratio of the charged particle signal 5 and the thickness of the deposited film 7 for each of the manufacturing method of the deposited film 7, the composition of the deposited film 7, or the crystallinity of the deposited film 7.

The examples of FIGS. 11 and 12 are also applicable to the charged particle beam device of FIG. 7 and the composite charged particle beam device of FIG. 8.

As described above, in the above-described examples, the relationship between the contrast of the deposited film 7 of the charged particle beam image and the thickness of the deposited film 7 on the sample 2 is made into a database and the database is stored in the storage unit 8. The calculation unit 9 can calculate the thickness of the sample 2 from the database. The charged particle beam device described above can accurately measure the thickness of the target sample 2 to be measured from the relationship between the thickness of the sample 2 and the signal intensity or the signal intensity ratio of the charged particle signal 5 obtained when the deposited film 7 is irradiated with the charged particle beam 4. Accordingly, it is possible to provide a thin film sample suitable for TEM or STEM observation.

The invention is not limited to the above-described embodiments and includes various modifications. The embodiments described above have been described in detail for easy understanding of the invention, and are not necessarily limited to those including all the configurations described above. In addition, a part of the configuration of one embodiment may be replaced with the configuration of another embodiment. In addition, the configuration of one embodiment can be added to the configuration of another embodiment. In addition, with respect to a part of the configuration of each embodiment, other configurations can be added, deleted, or replaced.

In addition, a part or all of the functions and the like of the calculation unit 9 described above may also be implemented by hardware, for example, by designing an integrated circuit. In addition, the above-described configurations, functions, and the like may also be implemented by software by interpreting and executing programs that implement respective functions by a processor. Information such as a program, a table, a file, and the like for implementing each function can be stored in various types of non-transitory computer readable medium. Examples of the non-transitory computer-readable medium include a flexible disk, a CD-ROM, a DVD-ROM, a hard disk, an optical disk, a magneto-optical disk, a CD-R, a magnetic tape, a nonvolatile memory card, a ROM, and the like.

In the above-described embodiments, control lines and information lines show what is considered necessary for the illustration, and not all the control lines and the information lines in the product are necessarily shown. All of the configurations may be connected to each other.

REFERENCE SIGN LIST 1 charged particle beam column
2 sample
3 sample support mechanism
4 charged particle beam
5 charged particle signal
6 detector
7 layer (deposited film)
8 storage unit
9 calculation unit
10 incident angle
11 line profile
12 deposited film forming function
13 ion beam column
14 ion beam
15 electron beam column
16 electron beam

The invention claimed is:

1. A charged particle beam device, comprising:
a charged particle beam column that is configured to emit a charged particle beam;
a sample support mechanism that is configured to support a sample to be measured;
a detector that is configured to detect a charged particle signal obtained when the sample is irradiated with the charged particle beam;
a storage unit that is configured to store in advance relationship information indicating a relationship between intensity or an intensity ratio of a charged particle signal obtained when a reference layer disposed on the sample is irradiated with the charged particle beam and a thickness of the reference layer; and
a calculation unit that is configured to calculate the thickness of the reference layer based on the relationship information and the intensity or the intensity ratio of the charged particle signal obtained by irradiating the reference layer with the charged particle beam, wherein
the thickness of the sample is measured based on the calculated thickness of the reference layer.

2. The charged particle beam device according to claim 1, wherein
the intensity ratio of the charged particle signal is a value obtained by dividing each signal intensity value by a signal intensity value in a range in which the signal intensity is constant.

3. The charged particle beam device according to claim 1, wherein
the reference layer is formed of a carbon film, a tungsten film, a platinum film, or an oxide film.

4. The charged particle beam device according to claim 1, wherein
the storage unit stores the relation information for each piece of energy of the charged particle beam.

5. The charged particle beam device according to claim 1, wherein
the storage unit stores the relation information for each incident angle of the charged particle beam.

6. The charged particle beam device according to claim 1, wherein
the storage unit stores the relation information for each type of the charged particle beam.

7. The charged particle beam device according to claim 1, wherein
the storage unit stores the relation information for each type of signal to be detected by the detector.

8. The charged particle beam device according to claim 1, wherein
the storage unit stores the relation information for each manufacturing method of the reference layer, composition of the reference layer, or crystallinity of the reference layer.

9. The charged particle beam device according to claim 1, further comprising:
a function of forming the reference layer on a surface of the sample using the charged particle beam and compound gas.

10. The charged particle beam device according to claim 1, wherein the sample has
a shape having a uniform thickness in a direction parallel to a lengthwise direction of the sample,
a shape in which the thickness changes continuously or discontinuously in the direction parallel to the lengthwise direction of the sample, or
a shape in which the thickness changes continuously or discontinuously in a direction parallel to a widthwise direction of the sample.

11. The charged particle beam device according to claim 1, wherein
the charged particle signal is a signal that detects (1) transmitted electrons, (2) reflected electrons, (3) secondary charged particles, or (4) tertiary charged particles caused by the transmitted electrons, the reflected electrons, or the secondary charged particles.

12. A composite charged particle beam device, comprising:
- an ion beam column that is configured to emit an ion beam;
- an electron beam column that is configured to emit an electron beam;
- a sample support mechanism that is configured to support a sample;
- a detector that is configured to detect a charged particle signal obtained when the sample is irradiated with the electron beam;
- a function of forming a reference layer on a surface of the sample using the ion beam or the electron beam and compound gas;
- a storage unit that is configured to store relationship information indicating a relationship between intensity or an intensity ratio of a charged particle signal obtained when the reference layer is irradiated with the electron beam and a thickness of the reference layer; and
- a calculation unit that is configured to calculate the thickness of the reference layer based on the relationship information and the intensity or the intensity ratio of the charged particle signal obtained by irradiating the reference layer with the charged particle beam, wherein the thickness of the sample is measured based on the calculated thickness of the reference layer.

13. A thickness measurement method of a sample, the method comprising:
- forming a reference layer on a surface of the sample;
- processing the reference layer and the sample using an ion beam;
- irradiating the processed sample with an electron beam;
- detecting a charged particle signal obtained when the processed reference layer is irradiated with the electron beam; and
- calculating a thickness of the reference layer based on (i) relationship information prepared in advance indicating a relationship between intensity or an intensity ratio of the charged particle signal and the thickness of the reference layer and (ii) the intensity or the intensity ratio of the charged particle signal obtained by irradiating the processed reference layer with the electron beam, and measuring a thickness of the sample based on the calculated thickness of the reference layer.

14. The sample thickness measurement method according to claim 13, wherein
the processed sample has
- a shape having a uniform thickness in a direction parallel to a lengthwise direction of the sample,
- a shape in which the thickness changes continuously or discontinuously in the direction parallel to the long direction of the sample, or
- a shape in which the thickness changes continuously or discontinuously in a direction parallel to a widthwise direction of the sample.

* * * * *